Feb. 26, 1963 F. F. OFFNER 3,079,565

ELECTRICAL AMPLIFIER

Filed July 12, 1956

United States Patent Office 3,079,565

Patented Feb. 26, 1963

3,079,565
ELECTRICAL AMPLIFIER

Franklin F. Offner, % Offner Electronics Inc., 5320 N. Kedzie Ave., Chicago 25, Ill.

Filed July 12, 1956, Ser. No. 597,455
2 Claims. (Cl. 330—10)

This invention relates to electronic amplifying devices and in particular to those utilized for oscillographic recorder aparatus. In general, the object of the invention is to provide an improved amplifier arrangement which offers accurate and rapid response with a high degree of stability.

A more specific object is to provide an amplifier system comprising an electronic amplifier of the so-called "chopper" type which is followed by a second or "output" amplifier such as, for example, a transistor D.-C. amplifier. One advantage of using a second amplifier following the demodulator component of the chopper amplifier is that one avoids the necessity of developing high powers in the demodulator component. Another advantage of using the two amplifiers in series arises from the fact that since the chopper amplifier is required to handle only very small powers, it may be operated at high frequencies, thus allowing amplification of higher frequencies than is possible with a chopper operating at low frequencies. High power is developed only in the "output" amplifier, i.e. the transistor amplifier, which does not involve any contact switches or "choppers" as are present in a chopper amplifier. There is no danger of erosion at the contact switch despite the higher switching frequencies because the currents and voltages are kept at a relatively low order.

Another object of the invention is to provide an amplifying and recording system comprising an input amplifier of the chopper type followed by an output amplifier, an oscillographic recorder including a coil receiving its energizing current from the output amplifier and two negative feedback circuits. One of these feedback circuits is responsive to the current through the coil at low frequencies and the other feedback circuit is responsive to the voltage across the coil at higher frequencies. The feedback proportional to coil curent is effective at low frequencies and tends to hold the coil current constant independent of its resistance. The advantage of this is that when high powers are applied to the coil, the coil temperature will increase and its resistance will therefore also increase. Normally this would decrease the coil current and thus its deflection but the use of negative feedback greatly reduces this undesirable effect on sensitivity. The feedback responsive to voltage across the coil serves to prevent loss of electrodynamic damping in the coil which otherwise would occur due to constant coil current independent of frequency. The coil voltage feedback circuit is effective in the higher frequency range including coil resonance where damping is required.

Yet another object of the invention is to provide an improved construction for a transistor amplifier.

The foregoing as well as other objects and advantages inherent in the invention will become more apparent from the following description of preferred embodiments thereof when considered with the accompanying drawings. In the latter, FIG. 1 is a circuit diagram showing the series connected input and output amplifier system;

Figures 1, 2, 3, 4, 5, 6, 7, 8, 9, 10, 11A, 11B:
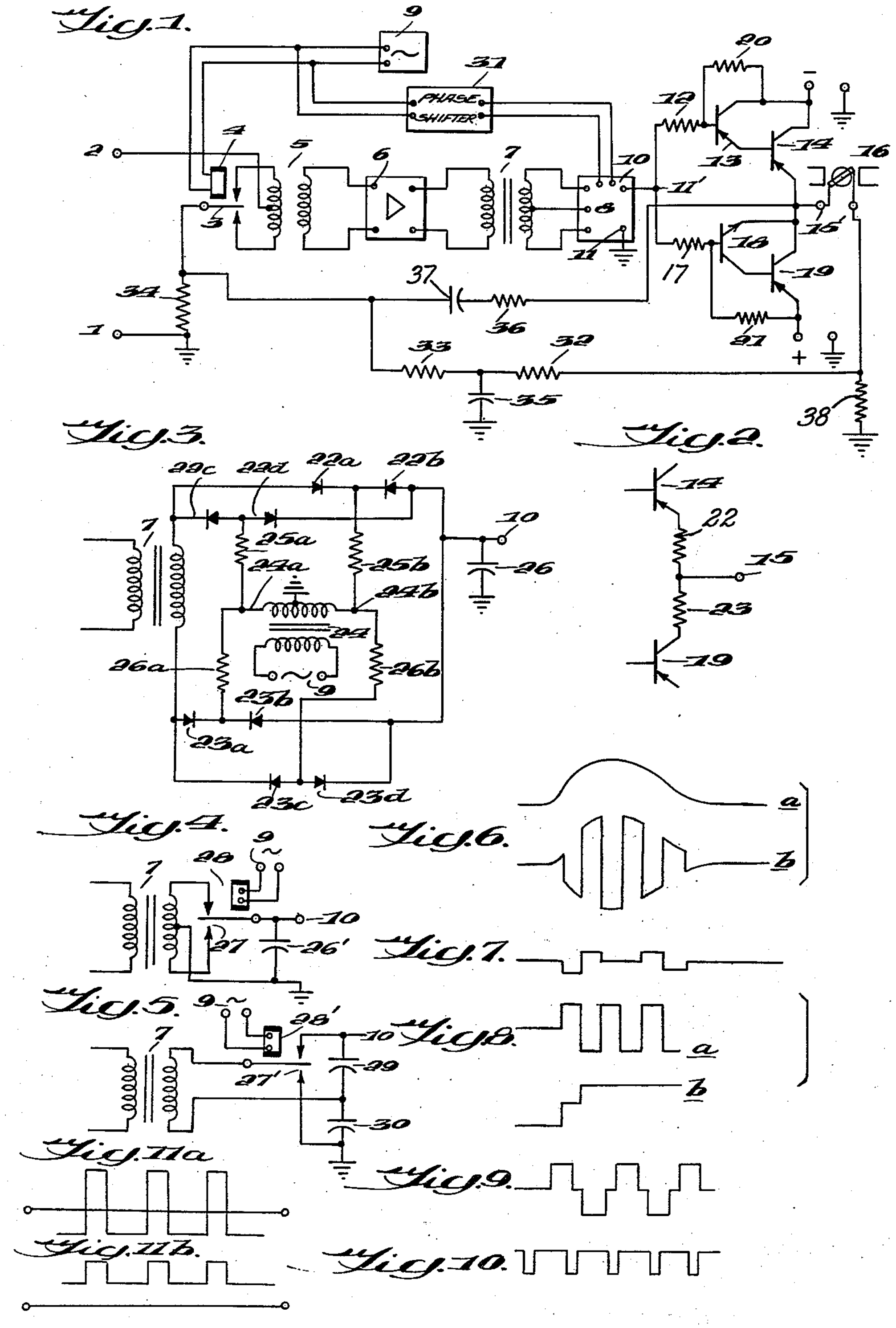
FIG. 2 shows a balancing circuit for the FIG. 1 circuit.
FIGS. 3, 4 and 5 show various types of demodulators usable in the FIG. 1 circuit.
FIG. 6 illustrates a type of undesired signal obtained with the demodulator of FIG. 4.
FIG. 7 illustrates the improved performance of the demodulator of FIG. 5.
FIG. 8 illustrates the principle of operation of FIG. 5.
FIG. 9 illustrates the wave form of a typical chopper.
FIG. 10 illustrates the undesired ripple which may be obtained with a chopper amplifier having improper adjustment.
FIGS. 11*a* and 11*b* show other types of signal output waves produced by a chopper.

Refering now to FIG. 1, illustrating the basic principles of the invention, the input terminals are 1 and 2. The input signal is converted into a square wave A.-C. by the action of vibrating chopper switch 3 which is driven by coil 4. This switch may be of the polarized type. The chopped signal is fed through transformer 5 having a center-tapped primary into amplifier 6. This amplifier may be of any type capable of responding to the frequency of chopper switch 3. The output of the amplifier is taken through output transformer 7, and fed through demodulator 8. This demodulator may be of several forms, to be later described.

The frequency source for operating the chopper switch 4 is generated by oscillator 9. Voltage from 9 is also introduced into 8 through phase shifter 31 for the purpose of demodulating the signal output. The demodulated signal, which will now be of substantially the same form as the input applied to terminals 1, 2, but amplified in power, appears across demodulator output terminals 10, 11. This output is now applied to a transistor D.-C. amplifier. The purpose of using this D.C. amplifier following the demodulator is to avoid the need of developing high powers in demodulator 8. A novel type of D.C. amplifier is employed, in which one side of the output may be connected to common, as well as one side of the input, and yet positive or negative currents may be passed through the load. The input is applied from the output terminal 10 of the demodulator, to input terminal 11′ of the D.-C. amplifier. There are in effect two amplifier paths. The upper is through resistor 12, into the base connection of p-n-p type junction transistor 13. The collector of 13 is connected to a source of negative voltage (with respect to common), while its emitter is connected to the base of output transistor 14. Similarly, the collector of 14 is connected to the source of negative voltage, while its emitter is connected to load terminal 15.

This side of the amplifier functions in the following manner: a negative signal applied to the input of 13 causes an amplified negative current through its emitter, and thus through the base of 14. A further amplified negative current is drawn through the emitter of 14, and thus through the load 16 connected to output terminal 15. Transistor 13 operates in a "common collector" circuit; thus, the signal voltage developed at its emitter will be substantially equal to the signal voltage applied to its base. The same applies to transistor 14, and thus, the voltage developed at its emitter, that is across the load 16, will be substantially equal to that applied to the base of 13.

The lower side of the amplifier will now be considered. The input signal from terminal 11′ is led through resistor 17 into the base of n-p-n type junction transistor 18. The collector of 18 is connected to the base of p-n-p type power transistor 19, while its emitter is connected to the collector of 19. The emitter of 19 is connected to a source of positive voltage.

It will be seen that the output transistor 19 of this portion of the amplifier operates in the common emitter manner, resulting in high voltage amplification, as well as current amplification. The input transistor 18 also operates in this manner, except that the full output voltage across the load is introduced in series with its emitter, so that this subtracts from the input voltage applied to its base. Thus, there is unity inverse feedback around this side of the amplifier, so that again there is unity gain substantially on this side of the amplifier, and the signal developed across the load 16 will be substantially equal to that applied to the input terminal 11'.

It is thus seen that a symmetrical "complementary" circuit is obtained, with the use of two power transistors, both of which may be p-n-p type. Alternatively, of course, in each position where a p-n-p unit is shown, an n-p-n may be employed, and vice versa, with the polarities of the power sources simultaneously reversed.

In general, a small bias voltage must be impressed between the base and emitter of a transistor to initiate current flow. To avoid a dead-band in the region of small signal voltage, resistors 20 and 21 are employed to provide a small voltage of appropriate polarity at the base of each input transistor in the absence of signal input. The series input resistors 12 and 17 are included to allow the application of this bias voltage.

The D.-C. amplifier circuit shown in the output of FIG. 1 will give quite symmetrical performance. However, its symmetry may be further improved by inclusion of resistors in the output, as shown in FIG. 2. In general, it is not necessary to use both resistors 22 and 23, but the one required is employed to give symmetry in the output signal.

Returning now to the load circuit, one side of the actuating coil 16 of the oscillograph is connected to terminal 15. The other side of the coil is connected through resistor 38 to common. The voltage drop across resistor 38, which is thus proportional to the amplitude of the current flowing through coil 16, is fed back to the input, through resistors 32 and 33, producing a voltage drop in series with the input signal across resistor 34. The amplifier is so connected that this feedback is in the negative sense; i.e., if the applied input signal is such as to make input terminal 2 positive, the feedback is such as to make the voltage appearing at the top of resistor 34 also positive, so that the net signal applied to the amplifier input is decreased.

Condenser 35 filters out all higher frequency components from the feedback. The constants of the circuit are so chosen that the feedback is considerably reduced at the frequency of mechanical resonance of the oscillograph. Thus, at low frequencies, the feedback is proportional to the current through 16, and tends to hold this current constant, independent of the resistance of 16. The advantage of this is that when high powers are applied to 16, the coil temperature will increase, and its resistance will therefore also increase. Normally, this would decrease the current flow through 16, and thus its deflection. Use of current feedback will greatly reduce this undesirable effect on sensitivity.

However, if the current through the coil were thus kept constant, and independent of frequency, electrodynamic damping would be largely cancelled, since such a constant current source has a very high equivalent series output resistance. As is well known, electrodynamic damping requires a low effective output resistance. Therefore, in the frequency range where damping is required, that is, at the higher frequencies, including resonance, voltage feedback is employed. This is obtained through resistor 36 and condenser 37.

The action of the feedback circuit is thus as follows: at low frequencies, current feedback, resulting from the voltage drop across 38, is employed. At high frequencies, voltage feedback, resulting from the voltage drop across the load, including resistor 38, is employed. The constants of the circuit are so chosen that the frequency response of the oscillograph is essentially independent of frequency below resonance, unless a different response characteristic is desired for some purpose.

Using the circuit of FIG. 1 has several other advantages, as compared to the circuit illustrated in my prior Patent No. 2,688,729. Since the chopper now must handle only very small powers, it may be operated at high frequencies, thus allowing the amplification of higher frequencies than is possible with a chopper operating at low frequencies. High power is developed only in the output amplifier, which does not involve any contact switches. Thus, no erosion of switches will be produced by the need of rapidly switching substantial currents and voltages.

One form of demodulator, of the electronic type, is shown in FIG. 3. The input is taken through transformer 7, which has a center-tapped secondary. Rectifier elements 22a–22d and 23a–23d are connected as illustrated. The voltage of carrier frequency is applied from source 9 to transformer 24 having a center-tapped secondary. The carrier voltage of proper polarity is applied to rectifiers 22 through resistors 25a and 25b; and to rectifiers 23 through resistors 26a and 26b.

The action of this form of demodulator is as follows: assume that during one half of the signal cycle, the top terminal of the secondary of 7 is positive; and that simultaneously, terminal 24a of the secondary of 24 is positive, and 24b, negative. These polarities of 24 are such as to make both pairs of rectifiers 22 conducting; but the positive polarity of 7 will make 22a more conducting, and 22c less. Thus, there will be a greater voltage drop in resistor 25b than in 25a, and more positive current will flow through 22d than negative through 22b. The result will be a positive signal developed at output terminal 10. A symmetrical result is obtained at the lower half of the demodulator during the other half cycle, again producing a positive signal at 10, giving full wave demodulation.

The purpose of condenser 26 is to filter out carrier frequency components.

FIG. 4 illustrates a demodulator employing a mechanical chopper switch 27, similar to input chopper 3, and used symmetrically with it. Its driving coil 28 is operated from source 9. Since the chopper in this circuit does not carry high power, it may operate at a high frequency, as does the input chopper.

A particularly rapidly responding and accurate form of demodulator is illustrated in FIG. 5. This circuit has the property of responding to rapid changes of input without the generation of undesired spurious signals. The manner in which this circuit is superior to that of FIG. 4 in this respect will be clear from the following discussion:

Assume that one component of the current passing through the primary of 7 is a progressively changing current (increasing or decreasing current). Such a current can rise from transients due to a suddenly applied input to the amplifier, for example, but irrespective of how the signal arises, it is desirable that the output not respond thereto, but only to the component of the current which is varying at the frequency of the chopper switches. The transformer will in effect partially differentiate the current, tending to produce a steady voltage across its output terminals, so long as the primary current is changing in one direction.

As a concrete case, consider that the direction of current rate-of-change is such as to cause the top terminal of the secondary of 7 to be positive, and the bottom negative. Then, as switch 27 vibrates from top to bottom and again to top contact, output terminal 10 will become positive, then negative, then positive again; in other words, in response to a steady voltage appearing at the secondary terminals of 7, the output of the demodulator becomes a voltage of carrier frequency. To remove this component from the output will require that condenser 26' provide ample filtering, thus reducing the speed of response of the output. At FIG. 6 is shown how the effect of such a transient would appear (in the absence of condenser 26'). At *a* is shown the transient voltage difference appearing at the secondary of 7; at *b*, the chopper-frequency voltage that appears at terminal 10.

Consider now the circuit of FIG. 5. When the chopper switch 27' is in its upper position, condenser 29 is charged to the secondary potential; when in the bottom, condenser 30 is so charged, but in the opposite sense, so that its potential subtracts from that of 29. Thus, so long as the secondary potential is constant, no sustained chopper frequency appears at terminal 10. The effect of the transient of FIG. 6*a* would be as shown in FIG. 7. It is thus seen that the demodulator circuit of FIG. 5 gives a chopper frequency output proportional only to the rate of change of the potential across the secondary of 7 (when this is not in synchronism with the chopper frequency), and thus much lower in amplitude than the intefering signal in the circuit of FIG. 4.

In FIGURE 8 is shown how the demodulator of FIG. 5 resopnds to the normal, desired signal input, as shown at *a*, for example. On the first half of the first cycle of an abruptly applied signal, one of the condensers 29, 30, is charged to the secondary potential; on the second half, the other condenser is so charged. The result is the reaching of the full signal output voltage in the time of one period.

It should be noted that condensers 29 and 30 are not intended as filters, but rather only to store the output potential during one cycle. As illustrated in FIG. 8, their presence does not necessarily slow down the response of the demodulator appreciably, if impedance relations are maintained at suitable values. That is to say, the functioning of the circuit depends upon the square wave being transmitted by the amplifier in an undistorted manner, as shown, for example, in FIG. 9, and the impedance of the output being such that condensers 29, 30 are only very slightly discharged during a chopper cycle and hence the potential stored by these condensers remains virtually unchanged during the half of the chopper cycle when the condenser is disconnected from the amplifier output. The longer the time constant of the output circuit, the better it will perform to minimize undesirable ripple effects. Another point of superiority of the demodulator circuit of FIG. 5, as compared to the conventional circuit of FIG. 4, is in regard to chopper frequency ripple in the output, with a constant applied signal. In general, the input chopper will not be perfectly symmetrical. Therefore, the duration of the signal waves on one side of the baseline will be longer than on the other. In FIG. 11*a* for example is illustrated a signal as would be produced by a chopper in which the contacts producing the signal above the baseline were closed only half as long as those producing the signal below the line (a rather extreme case, to clearly illustrate the point). Since the transformers 5 and 7, as well as the amplifier 6 (in most designs) will not pass D.-C., it is necessary that the signal appearing at the secondary of 7 have equal areas above and below the zero line; in the example, therefore, the upward waves must be twice the amplitude of the lower, or in other words, the amplitudes are in inverse ratio to their durations.

Now the action of the chopper 27 is to invert alternate half cycles, so that (if condenser 26′ were not present), the output wave would appear as at 11*b*, at output terminal 10. The large ripple voltage must be filtered out by condenser 26′. The large condenser that would be required would considerably slow the response of the system.

The demodulator of FIG. 5 does not suffer from this defect. The only effect of the asymmetry is to make the first step of the response illustrated in FIG. 8*b* different in amplitude from the second step: for example, in the wave of FIG. 11*a*, of half (or twice) the amplitude. After one full chopper cycle, however, there is no further ripple, in theory.

Another factor to be considered where a chopper type demodulator is employed is the relation of the contact dwell of the input and output choppers. With the circuit of FIG. 1, for example, the wave form of the signal developed across the secondary of 7 will be actually as shown in FIG. 9, when a steady input voltage is applied. It will be seen that during the time of travel of the moving contact from one side contact to the other, the transformer is disconnected from the source, and the input is zero during this time. If now the output chopper of either FIG. 4 or FIG. 5 remains closed for a longer period of time than the input, during that portion of the cycle when the input is open and the output is closed, the output terminal 10 will be connected to a source of zero potential, and will in effect be shorted. This will cause the output to fall to zero during these portions of the cycle, causing a ripple voltage to appear in the output. Other effects can also occur with switching, depending upon the chopper and transformer characteristics, such as inductive surges, etc., further distorting the wave form at the time of input switching. It is therefore desirable to have the output chopper so synchronized with the input therefore that it remains closed a shorter time, during the portion of the cycle that the input chopper is closed and producing a substantially constant, transient-free wave. This can be achieved by properly adjusting the two choppers for phase relationship and dwell time.

It should here be further mentioned that where the chopper demodulator is employed, it may be either operated by a separate driving coil (as illustrated), or it may be mechanically coupled to the input chopper.

In FIG. 1, the load is diagrammatically shown as element 16, a coil operating a marking pen, the coil rotating in a magnetic field, but being restrained by a restoring spring, as in a D'Arsonval galvanometer. Other types of oscillographic elements may also be employed; and the load may also be connected directly across the output terminal 10 of the demodulator, understanding then, however, the limitation on power handling capacity produced thereby.

It remains to describe the function of phase shifter 31. The purpose of this element is to properly phase the input chopper 3 and the demodulator 8. Where different types of modulator (input chopper) and demodulator are employed, there may be a phase shift between them. This is compensated by 31, which may be any one of a number of types: One method is to merely place an inductance or capacity in series, depending upon whether a lag or lead is desired. Obviously, the phase shifter could as well be placed in series with the operating coil 4 of input chopper 3.

While the various elements of this invention have been shown operating in a cooperative manner which presents unique advantages, it should be pointed out that the various elements can be used separately, and in conjunction with elements of other types for giving their individual advantages as disclosed herein.

I claim:

1. An amplifier of the chopper type for transmitting signals including step input and characterized by having an output responding essentially completely to said step input in one complete chopper cycle and thereby transmitting an essentially undistorted facsimile of signals changing at frequencies below the chopper frequency, the combination including an input chopper amplifying means transmitting the chopper signal as an essentially square wave, and demodulator means, said demodulator means comprising an output chopper operated synchronously with said input chopper and connected to the output side of said amplifying means, two condensers so connected to said output chopper that one condenser is charged by the output of said amplifying means during one half of the chopper cycle and the other condenser so charged during the other half of said cycle, each said condenser being so proportioned with respect to any load connected to the output that the voltage stored by the condenser remains essentially unchanged during the half of the chopper cycle when the condenser is disconnected from the chopper output, said amplifier means having an output impedance sufficiently low so that the voltage signal impressed on said condensers remains essentially constant during each condenser charging period whereby the square top nature of said square wave remains essentially undistorted, and connections to said condensers so that the output signal is constituted by the sum of the potentials across said condensers, whereby the ripple frequencies of chopper frequency and multiples thereof are essentially eliminated from the output signal.

2. An amplifier of the mechanical contactor chopper type for transmitting signals including step input and characterized by having an output responding essentially completely to said step input in one complete chopper cycle and thereby transmitting an essentially undistorted facsimile of signals changing at frequencies below the chopper frequency, the combination including an input mechanical contactor chopper, amplifying means transmitting the chopper signal as an essentially square wave, and demodulator means, said demodulator means comprising an output mechanical contactor chopper operated synchronously with said input chopper and connected to the output side of said amplifying means, means actuating said choppers such that the contacts of said output chopper are closed for a period during only a portion of the time that the contacts of said input chopper are closed, said closed period for the contacts of said output chopper being during the period when said square wave is of essentially constant amplitude, two condensers so connected to said output chopper that one condenser is charged by the output of said amplifying means during one half of the chopper cycle and the other condenser so charged during the other half of said cycle, each said condenser being so proportioned with respect to any load connected to the output that the voltage stored by the condenser remains essentially unchanged during the half of the chopper cycle when the condenser is disconnected from the chopper output, said amplifier means having an output impedance sufficiently low so that the voltage signal impressed on said condensers remains essentially constant during each condenser charging period whereby the square top nature of said square wave remains essentially undistorted, and connections to said condensers so that the output signal is constituted by the sum of the potentials across said condensers, whereby the ripple frequencies of chopper frequency and multiples thereof are essentially eliminated from the output signal.

References Cited in the file of this patent

UNITED STATES PATENTS

| | | |
|---|---|---|
| 2,098,950 | Black | Nov. 16, 1937 |
| 2,162,239 | Beuermann | June 13, 1939 |
| 2,297,543 | Eberhardt et al. | Sept. 29, 1942 |
| 2,329,073 | Mitchell et al. | Sept. 7, 1943 |
| 2,440,145 | Heutten | Apr. 20, 1948 |
| 2,449,214 | Gelzer | Sept. 14, 1948 |
| 2,459,730 | Williams | Jan. 18, 1949 |
| 2,529,459 | Pourciau et al. | Nov. 7, 1950 |
| 2,614,188 | Williams | Oct. 14, 1952 |
| 2,688,729 | Offner | Sept. 7, 1954 |
| 2,758,079 | Eckfeldt | Aug. 7, 1956 |
| 2,773,946 | Greenberg | Dec. 11, 1956 |
| 2,789,164 | Stanley | Apr. 16, 1957 |
| 2,832,848 | Neff | Apr. 29, 1958 |
| 2,874,235 | Hartwig | Feb. 17, 1959 |
| 2,879,474 | Uiga | Mar. 24, 1959 |
| 2,888,523 | Ross | May 26, 1959 |
| 2,896,029 | Lin | July 21, 1959 |

OTHER REFERENCES

Article by G. C. Sziklai published in Electronic Engineer, September 1953, pages 358–364 (only Fig. 8, page 359, relied upon).

Kay Lab. D.C. Microvolt Ammeter and Amplifier Model 203, published by Kay Lab., 5725 Kearney Villa Road, San Diego 12, California (only page 2 relied upon).